(12) United States Patent
Hanna et al.

(10) Patent No.: US 11,733,296 B2
(45) Date of Patent: Aug. 22, 2023

(54) SCREENING METHOD FOR PIN DIODES USED IN MICROWAVE LIMITERS

(71) Applicant: Honeywell Federal Manufacturing & Technologies, LLC, Kansas City, MO (US)

(72) Inventors: Charles John Hanna, Gardner, KS (US); Tuan N. Nguyen, Olathe, KS (US); Will Schulte Plamann, Leawood, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 415 days.

(21) Appl. No.: 16/851,328

(22) Filed: Apr. 17, 2020

(65) Prior Publication Data

US 2021/0325459 A1    Oct. 21, 2021

(51) Int. Cl.
*G01R 31/317* (2006.01)
*H03G 11/02* (2006.01)

(52) U.S. Cl.
CPC ....... *G01R 31/31713* (2013.01); *H03G 11/02* (2013.01)

(58) Field of Classification Search
None
See application file for complete search history.

(56) References Cited

U.S. PATENT DOCUMENTS

| | | | | |
|---|---|---|---|---|
| 5,212,408 A * | 5/1993 | Even-Or | ................ | H03K 17/74 327/493 |
| 5,683,917 A * | 11/1997 | Martin | ................... | H01L 22/20 438/15 |
| 10,903,837 B2 * | 1/2021 | Van Zyl | ................ | H04W 52/00 |
| 10,951,177 B1 * | 3/2021 | Montgomery | .......... | H03F 3/189 |
| 2011/0255204 A1 * | 10/2011 | Satomi | ................ | H03G 11/025 361/111 |
| 2019/0214986 A1 * | 7/2019 | Van Zyl | ................ | H03K 17/74 |

FOREIGN PATENT DOCUMENTS

| CN | 105954662 | | 9/2016 |
| CN | 106841970 | | 6/2017 |
| CN | 111880071 A * | 11/2020 | ......... G01R 31/2601 |

OTHER PUBLICATIONS

Anantharam et al. (Analytical Solutions for Breakdown Voltages of Punched-Through Diodes Having Curved Junction Boundaries at the Edges). IEEE Transactions of Electron Devices, vol. ED-27, No. 5, May 1980; V. Anantharam and K.N. Bhat.

(Continued)

*Primary Examiner* — Jermele M Hollington
(74) *Attorney, Agent, or Firm* — Hovey Williams LLP

(57) ABSTRACT

A method of testing a PIN diode for a power limiter circuit comprises measuring a reverse bias current of the PIN diode; applying a reverse bias voltage to the PIN diode; increasing the reverse bias voltage until the reverse bias current of the PIN diode reaches a threshold current indicative of a reverse voltage breakdown; and determining whether the reverse bias breakdown voltage of the PIN diode is within an acceptable range of reverse bias breakdown voltages corresponding to a power range at which the power limiter circuit would enter power limiting mode with the PIN diode.

20 Claims, 3 Drawing Sheets

(56) References Cited

OTHER PUBLICATIONS

Macom Publication (Design with PIN Diodes). M/A-COM Technology Solutions Inc.; Application Note AG312; Rev. V3.
King et al. (Performance and Breakdown Characteristics of Irradiated Vertical Power GaN P-i-N Diodes). US Department of Energy Office of Scientific and Technical Information; https://www.osti.gov/biblio/1239987.
Microsemi-Watertown Publication (The PIN Diode Circuit Designers' Handbook). Microsemi Corp.—Watertown.

* cited by examiner

SCREENING METHOD FOR PIN DIODES USED IN MICROWAVE LIMITERS

STATEMENT REGARDING FEDERALLY-SPONSORED RESEARCH OR DEVELOPMENT

This invention was made with Government support under Contract No.: DE-NA-0002839 awarded by the United States Department of Energy/National Nuclear Security Administration. The Government has certain rights in the invention.

BACKGROUND

Power limiter circuits are often used in radio-frequency (RF) applications for protecting circuitry from RF signals above a certain threshold. Such a power limiter circuit often includes a PIN diode for shunting the RF signals above the threshold to ground. Due to manufacturing variables, PIN diodes have different power limiting performances; thus, a PIN diode implemented in a power limiter circuit may have an unexpected performance. In some circumstances, the unexpected performance can allow the power at which the power limiter circuit enters power limiting mode to be too high, which could damage RF circuitry.

To avoid this, each PIN diode must be tested to ensure that it shunts the power at an appropriate threshold. However, in manufacturing contexts, a plurality of power limiter circuits must be built to test each PIN diode. This testing may not be reliable in bulk due to variations in each power limiter circuit that would affect performance. Additionally, it involves costly labor and adds significant time to the manufacturing process.

The background discussion is intended to provide information related to the present invention which is not necessarily prior art.

SUMMARY

The present invention solves the above-described problems and other problems and provides a distinct advance in the art of testing PIN diodes. More particularly, embodiments of the present invention provide methods of quickly, accurately, consistently, and cost-effectively testing PIN diodes.

A method for testing a PIN diode for a power limiter circuit according to an embodiment of the present invention broadly comprises measuring a reverse bias current of the PIN diode; applying a reverse bias voltage to the PIN diode; increasing the reverse bias voltage until the reverse bias current of the PIN diode reaches a threshold current indicative of a reverse voltage breakdown; and determining whether the reverse bias breakdown voltage of the PIN diode is within an acceptable range of reverse bias breakdown voltages corresponding to a power range at which the power limiter circuit would enter power limiting mode with the PIN diode.

In some embodiments, the method may further comprise randomly selecting from a group of PIN diodes a plurality of test PIN diodes; measuring a reverse bias breakdown voltage for each of the test PIN diodes; incorporating each of the test PIN diodes into corresponding power limiter circuits; measuring a power at which each of the corresponding power limiter circuits enters power limiting mode; and determining an acceptable range of reverse bias breakdown voltages based on the power at which each of the corresponding power limiter circuits entered power limiting mode.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figure 1:
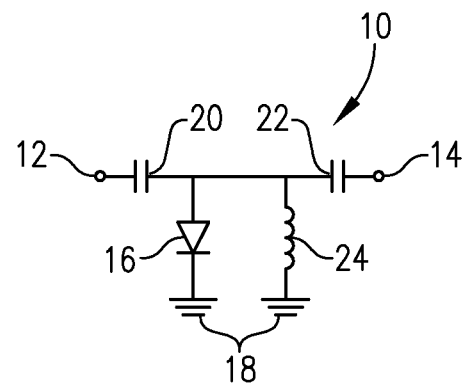
FIG. 1 is a schematic diagram of an exemplary power limiter circuit having a PIN diode for testing according to an embodiment of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Embodiments of the present invention comprise methods of testing PIN diodes in power limiting circuits. An exemplary power limiter circuit 10 having a PIN diode 16 is depicted in FIG. 1. The power limiter circuit 10 may include an input 12, an output 14, the PIN diode 16 connected to ground 18, a pair of direct current (DC) blocks 20, 22, and a radio-frequency (RF) choke 24. The input 12 is operable to receive an input signal, and the output 14 is operable to transmit the input signal below the limiting power level. The PIN diode 16 is operable to enter forward bias mode when the input signal is at or above a predetermined power level (the limiting power level) and direct the signal to ground and/or reflect the signal. The DC blocks 20, 22 prevent DC signals from passing through the power limiter circuit 10. The DC blocks 20, 22 may comprise one or more capacitors having particular capacitances. The RF choke 24 is also operable to prevent DC signals, or signals below a certain frequency, from passing through the output 14. The RF choke 24 may comprise an inductor having a particular inductance.

Figure 2:
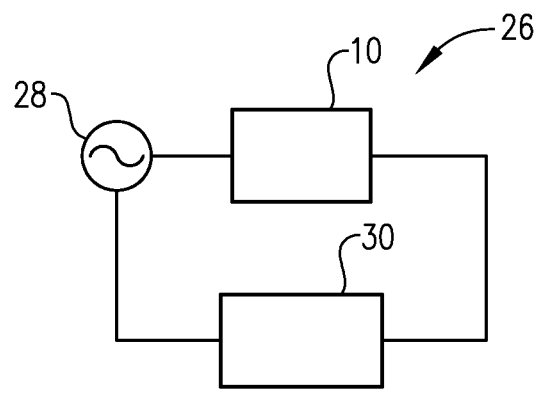
FIG. 2 is a first testing system used for testing the power limiter circuit of FIG. 1 in accordance with an embodiment of the present invention.

Turning to FIG. 2, a power limiter circuit testing system 26 for testing the power limiter circuit 10 according to an embodiment of the present invention is depicted and comprises a signal generator 28 and a measuring device 30. The signal generator 28 may be an independent device or may be part of the measuring device 30. In some embodiments, the measuring device 30 may be configured to control the signal generator 28. For example, the measuring device 30 may be a curve tracer, a multimeter, oscilloscope, or the like. The signal generator 28 is configured to insert a signal into the input 12 of the power limiter circuit 10, and the measuring device 30 is configured to detect the output signal from the output 14. The signal generator 28 may insert signals with increasing power levels until the signals reach a predetermined maximum power level. In some embodiments, the signal generator 28 may be configured to increase the power level of the input signal until the measuring device 30 detects that the power limiter circuit 10 has entered power limiting mode.

Figure 3:
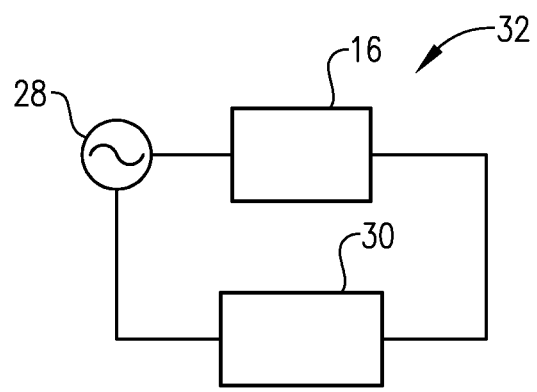
FIG. 3 is a second testing system used for testing the PIN diode of FIG. 1 in accordance with an embodiment of the present invention.

Turning to FIG. 3, a PIN diode testing system 32 for testing the PIN diode 16 according to an embodiment of the present invention is depicted. The PIN diode testing system 32 is configured to test the PIN diode 16 and also includes the signal generator 28 and the measurement device 30. In particular, the system 32 may be configured to determine the reverse bias breakdown voltage of the PIN diode 16. The signal generator 28 may be configured to apply an increasing reverse bias voltage to the PIN diode 16 up to a maximum voltage. In some embodiments, the measurement device 30 may be configured to direct the signal generator 28 to increase the voltage until the PIN diode 16 enters reverse bias voltage breakdown mode. The measurement device 30 may configured to detect reverse bias voltage breakdown mode based on a measured reverse bias current reaching a threshold current. In some embodiments, the threshold current may be 10 microamps.

The inventors have discovered that the reverse bias voltage breakdown of the PIN diode 16 is substantially related to the RF limiting power of its corresponding power limiter circuit 10. For example, a group of PIN diodes 16 having a particular rating may be tested for conformity to power limiting specifications. The rating of the PIN diodes 16 may all be the same and may be associated with a forward bias voltage, a forward bias resistance, and/or a power rating, or other the like. A test group from the group of PIN diodes 16 may be randomly selected and each implemented into separate power limiter circuits 10. Alternatively, each may be individually implemented into a single power limiter circuit 10 and removed for implementing a subsequent test PIN diode 16. The limiting powers of each PIN diode 16 in the test group of PIN diodes 16 may be determined using the power limiter testing system 26.

The reverse bias voltage breakdown of the PIN diodes 16 from the test group may be determined using the PIN diode testing system 32. Each test PIN diode 16 may be tested with the PIN diode testing system 32 to determine its reverse bias voltage breakdown.

The data from the test PIN diodes 16 can be used to determine whether the rest of the PIN diodes in the group are acceptable. The reverse bias voltage breakdown of the test PIN diodes 16 can be compared with their corresponding limiting powers to find a range of acceptable reverse bias voltage breakdowns that correspond to limiting powers within specification. One or more of the remaining, non-test, PIN diodes 16 can be tested using just the PIN diode testing system 32 to find their reverse bias voltage breakdowns and thereafter determine whether the limiting power of one or more of the remaining PIN diodes 16 would be within specification.

Figure 4:
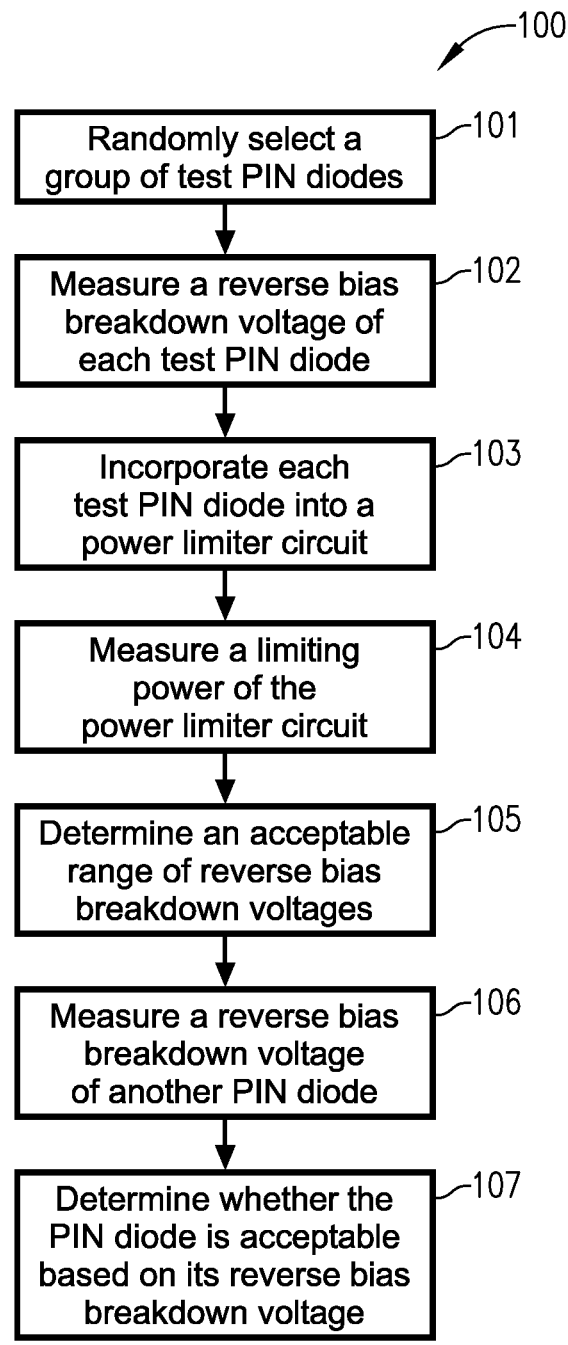
FIG. 4 is a flowchart illustrating at least a portion of the steps for testing a PIN diode according to an embodiment of the present invention.

The flow chart of FIG. 4 depicts the steps of an exemplary method 100 of testing a PIN diode for a power limiter circuit, such as the PIN diode 16 of the power limiter circuit 10. In some alternative implementations, the functions noted in the various blocks may occur out of the order depicted in FIG. 4. For example, two blocks shown in succession in FIG. 4 may in fact be executed substantially concurrently, or the blocks may sometimes be executed in the reverse order depending upon the functionality involved. In addition, some steps may be optional.

The method 100 is described below, for ease of reference, as being executed by exemplary devices and components introduced with the embodiments illustrated in FIGS. 1-3. However, some of such actions may be distributed differently among such devices or other devices without departing from the spirit of the present invention.

Referring to step 101, a group of test PIN diodes may be randomly selected from a group of PIN diodes. The group of PIN diodes may be associated with one or more ratings, such as a forward bias voltage, a forward bias resistance, and/or a power rating, or the like. Additionally the group of PIN diodes may be from a same manufacturing batch, lot, or manufacturer.

Referring to step 102, a reverse bias breakdown voltage for each of the test PIN diodes may be measured. The reverse bias breakdown voltages may be measured using the PIN diode testing system, which may include a curve tracer. An increasing reverse bias voltage may be applied to each of the test PIN diodes until a measured reverse bias current achieves a threshold, such as 10 microamps. The reverse bias breakdown voltage for each PIN diode may be recorded.

Referring to step 103, each of the test PIN diodes may be incorporated into corresponding power limiter circuits. Each test PIN diode may be implemented into a power limiter circuit. Additionally or alternatively, each test PIN diode may be implemented one-at-a-time into a single power limiter circuit. The power limiter circuits may include a pair of DC blocks and an RF choke.

Referring to step 104, a limiting power at which each of the corresponding power limiter circuits enters power limiting mode is measured. The limiting power may be measured using the power limiter test circuit. For example, a power of a signal injected into each power limiter circuit may be increased until the power limiter circuit enters power limiting mode. The limiting power for the power limiter circuits corresponding to each test PIN diode may be recorded. In some embodiments, the step 104 of determining limiting power may occur before the step 102 of determining reverse bias breakdown voltage.

Referring to step 105, an acceptable range of reverse bias breakdown voltages may be determined based at least in part on the reverse bias breakdown voltages of the test PIN diodes. The reverse bias breakdown voltages of the test PIN diodes may be compared with the limiting powers at which each of the corresponding power limiter circuits entered power limiting mode. The reverse bias breakdown voltages of the test PIN diodes that were associated with limiting powers within specification may be used to determine the acceptable range of reverse bias breakdown voltages. Additionally, a correlation and/or a line of regression may be determined for predicting limiting powers of other PIN diodes in the future. Such as the rest of the PIN diodes in the same lot, batch, order, or PIN diodes associated with the same rating.

Referring to step 106, a reverse bias breakdown voltage of one or more of the remaining PIN diodes not in the test group may be measured. This step 106 may include measuring the reverse bias breakdown voltages using the PIN diode testing system, which may include a curve tracer. An increasing reverse bias voltage may be applied to the one or more remaining PIN diodes until a measured reverse bias current achieves a threshold, such as 10 microamps.

Referring to step 107, the reverse bias breakdown voltage of the one or more remaining PIN diodes may be used to determine whether the one or more PIN diodes are acceptable. For example, if the reverse bias breakdown voltage is outside the range of acceptable reverse bias breakdown voltages, then the one or more PIN diodes may be determined to be outside of specification and therefore rejected for a power limiter circuit.

The method 100 may include additional, less, or alternate steps and/or device(s), including those discussed elsewhere herein.

EXPERIMENTAL DETAILS

A first group of PIN diodes ("1G") were tested using methods according to embodiments of the present invention, and a second group of PIN diodes from a different source ("2G") were also tested using methods according to embodiments of the present invention. The reverse bias breakdown voltage of each PIN diode in the first group and the second group was measured. Additionally, each PIN diode in the first group and the second group was incorporated into a limiter circuit, and the limiting power of the limiter circuit was measured.

Figure 5:
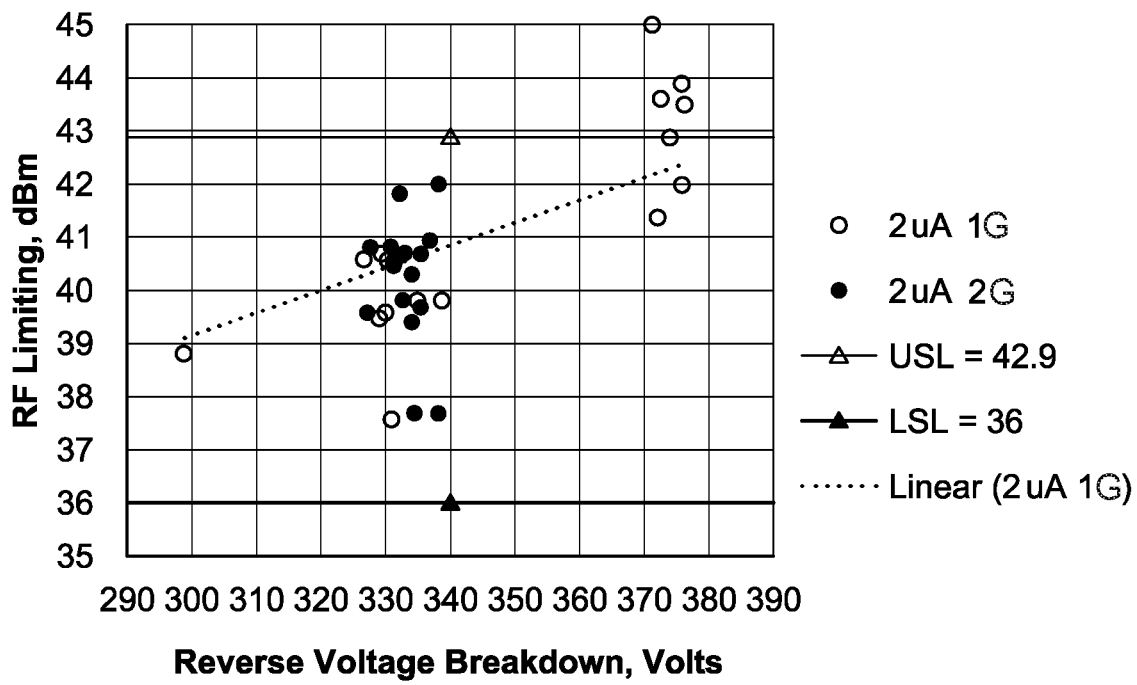
FIG. 5 is a chart illustrating a relationship between limiting power and reverse bias breakdown voltages with a range of acceptable limiting power imposed on the chart.

The limiting power of the limiter circuit was graphed as a function of the reverse bias breakdown voltage of its PIN diode, as depicted in FIG. 5. The upper specification limit (USL) and the lower specification limit (LSL) were then superimposed on the graph. A linear line of regression for the 1G PIN diodes was also calculated and imposed on the graph, which may be used for future testing of PIN diodes.

Figure 6:
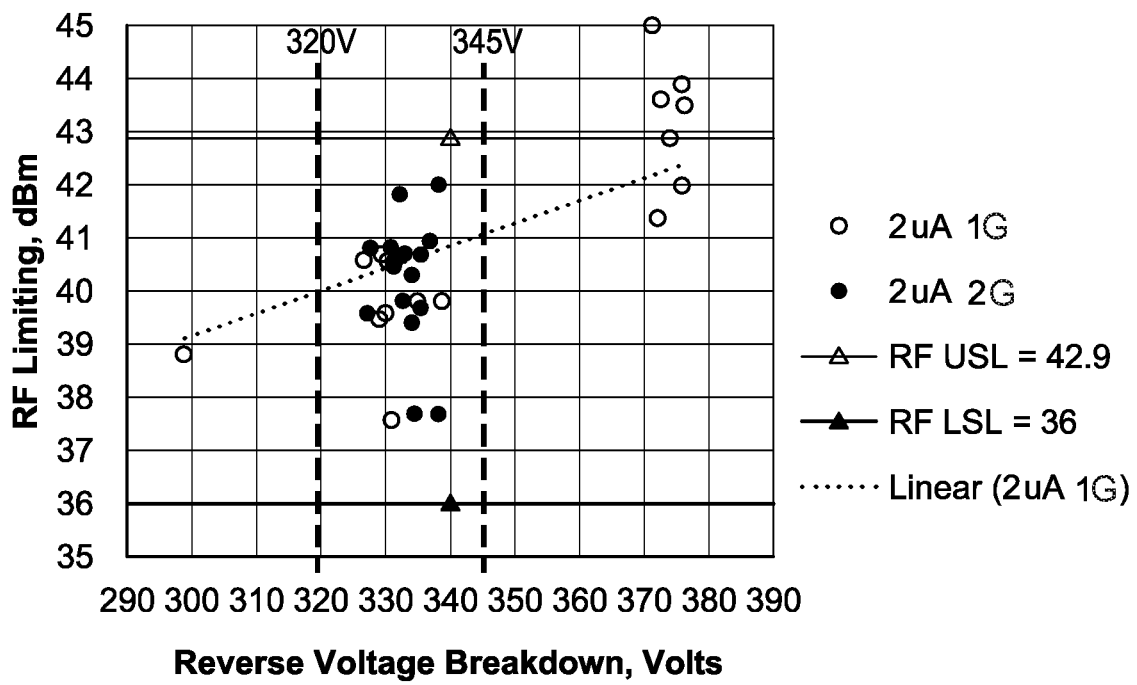
FIG. 6 is a chart illustrating a range of acceptable reverse bias breakdown voltages based on the relationship of FIG. 5.

The acceptable range of reverse bias breakdown voltages were determined based on the reverse bias breakdown voltages of PIN diodes implemented in limiter circuits having limiting powers within specification. FIG. 6 depicts the range of acceptable reverse bias breakdown voltages.

The vertical dotted lines superimposed on the graph represent the range of acceptable reverse bias breakdown voltages. Based on the results depicted in FIG. 6, any additional PIN diodes in the same lot as the tested PIN diodes can be tested by merely applying a reverse bias voltage and determining whether it is within the acceptable range.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A method of testing a PIN diode for a power limiter circuit, the method comprising:
   measuring a reverse bias current of the PIN diode;
   applying a reverse bias voltage to the PIN diode;
   increasing the reverse bias voltage until the reverse bias current of the PIN diode reaches a threshold current indicative of a reverse bias voltage breakdown; and
   determining whether the reverse bias breakdown voltage of the PIN diode is within an acceptable range of reverse bias breakdown voltages corresponding to a power range at which the power limiter circuit would enter power limiting mode with the PIN diode.

2. The method of claim 1, wherein the acceptable range of reverse bias breakdown voltages is associated with a forward bias voltage rating of the PIN diode.

3. The method of claim 1, wherein the threshold current is at least around 10 microamps.

4. The method of claim 1, wherein the acceptable range of reverse bias breakdown voltages is associated with a forward bias resistance rating.

5. The method of claim 1, wherein the PIN diode is a select PIN diode, further comprising—
   selecting from a group of PIN diodes a first group of test PIN diodes;
   measuring a reverse bias breakdown voltage for each of the first group of test PIN diodes;
   connecting each of the first group of test PIN diodes into corresponding power limiter circuits;
   measuring a power at which each of the corresponding power limiter circuits enter power limiting mode; and
   determining the acceptable range of reverse bias breakdown voltages based on the power at which each of the corresponding power limiter circuits entered power limiting mode.

6. The method of claim 5, wherein the power limiter circuits comprise a DC block and an RF choke.

7. The method of claim 6, wherein the RF choke comprises an inductor.

8. The method of claim 6, wherein the DC block comprises a capacitor.

9. The method of claim 5, wherein the acceptable range of reverse bias breakdown voltages is at least partially based on a correlation between the reverse bias breakdown voltages of the first group of test PIN diodes and the power at which each of the corresponding power limiter circuits entered power limiting mode.

10. The method of claim 9, wherein the correlation comprises a correlation coefficient of at least about 0.5.

11. The method of claim 9, wherein the acceptable range of reverse bias breakdown voltages is at least partially based on the correlation and an acceptable range of powers at which each of the corresponding power limiter circuits entered power limiting mode.

12. The method of claim 5, wherein the select PIN diode is configured to enter an on state when the power limiter circuit enters power limiting mode.

13. The method of claim 1, wherein the reverse bias voltage breakdown is determined using a curve tracer.

14. A method of testing a PIN diode for a power limiter circuit, the method comprising:
    determining an acceptable range of reverse bias breakdown voltages of the PIN diode based on a power at which a test power limiter circuit comprising a test PIN diode enters power limiting mode and a reverse bias breakdown voltage of the test PIN diode;
    measuring a reverse bias breakdown voltage of the PIN diode; and
    determining whether the reverse bias breakdown voltage of the PIN diode is within the acceptable range of reverse bias breakdown voltages.

15. The method of claim 14, further comprising deriving the acceptable range of reverse bias breakdown voltages based at least in part on a correlation between a reverse bias breakdown voltage of the test PIN diode and the power at which the test power limiter circuit enters power limiting mode.

16. The method of claim 14, wherein a forward bias voltage rating of the test PIN diode is the same as a forward bias voltage rating of the PIN diode.

17. A method of testing a select PIN diode for a power limiter circuit, the method comprising:
    selecting from a group of PIN diodes a plurality of test PIN diodes;
    measuring a reverse bias breakdown voltage for each of the test PIN diodes;
    incorporating each of the test PIN diodes into corresponding power limiter circuits;
    measuring a power at which each of the corresponding power limiter circuits enters power limiting mode;
    determining an acceptable range of reverse bias breakdown voltages based on the power at which each of the corresponding power limiter circuits entered power limiting mode;
    measuring a reverse bias breakdown voltage of the select PIN diode; and
    determining whether the reverse bias breakdown voltage of the select PIN diode is within the acceptable range of reverse bias breakdown voltages.

18. The method of claim 17, wherein the power limiter circuits each comprise a pair of DC blocks in series with one another and an RF choke.

19. The method of claim 18, wherein the RF choke comprises an inductor.

20. The method of claim 18, wherein the DC blocks comprise capacitors.

* * * * *